United States Patent [19]

Hafner et al.

[11] 3,914,836

[45] Oct. 28, 1975

[54] METHOD FOR PROCESSING QUARTZ CRYSTAL RESONATORS

[75] Inventors: Erich Hafner, New Shrewsbury; John R. Vig, Colts Neck, both of N.J.

[73] Assignee: The United States of America as represented by the Secretary of the Army, Washington, D.C.

[22] Filed: June 21, 1974

[21] Appl. No.: 481,736

[52] U.S. Cl. ................ 29/25.35; 29/470.1; 29/494; 29/DIG. 44; 117/213; 117/229; 250/504

[51] Int. Cl.² .................... H01L 41/22; H04R 31/00

[58] Field of Search 29/25.35, 470.1, 494, DIG. 44; 117/213, 229, 54; 219/121 LM; 250/504

[56] References Cited

UNITED STATES PATENTS

| | | | |
|---|---|---|---|
| 2,586,625 | 2/1952 | Downey | 250/504 |
| 2,765,765 | 10/1956 | Bigler et al. | 29/25.35 |
| 3,048,912 | 8/1962 | Belser et al. | 29/25.35 |
| 3,497,944 | 3/1970 | Antle | 29/494 |
| 3,597,579 | 8/1971 | Lumley | 219/121 LM |
| 3,691,720 | 9/1972 | Anderson et al. | 29/DIG. 44 |

FOREIGN PATENTS OR APPLICATIONS

| | | | |
|---|---|---|---|
| 1,938,948 | 2/1971 | Germany | 29/494 |

*Primary Examiner*—Carl E. Hall

*Attorney, Agent, or Firm*—Nathan Edelberg; Robert P. Gibson; Roy E. Gordon

[57] ABSTRACT

Precision quartz crystal resonators are processed in a high vacuum system in which all processing steps are performed in the same vacuum system without venting between stages. The processing steps include cleaning the resonator parts to remove contaminants from the surface, baking the resonator parts at temperatures up to 450°C to further remove adsorbed and absorbed contaminants, plating electrodes onto the crystal resonator, and sealing the resonator parts.

15 Claims, 1 Drawing Figure

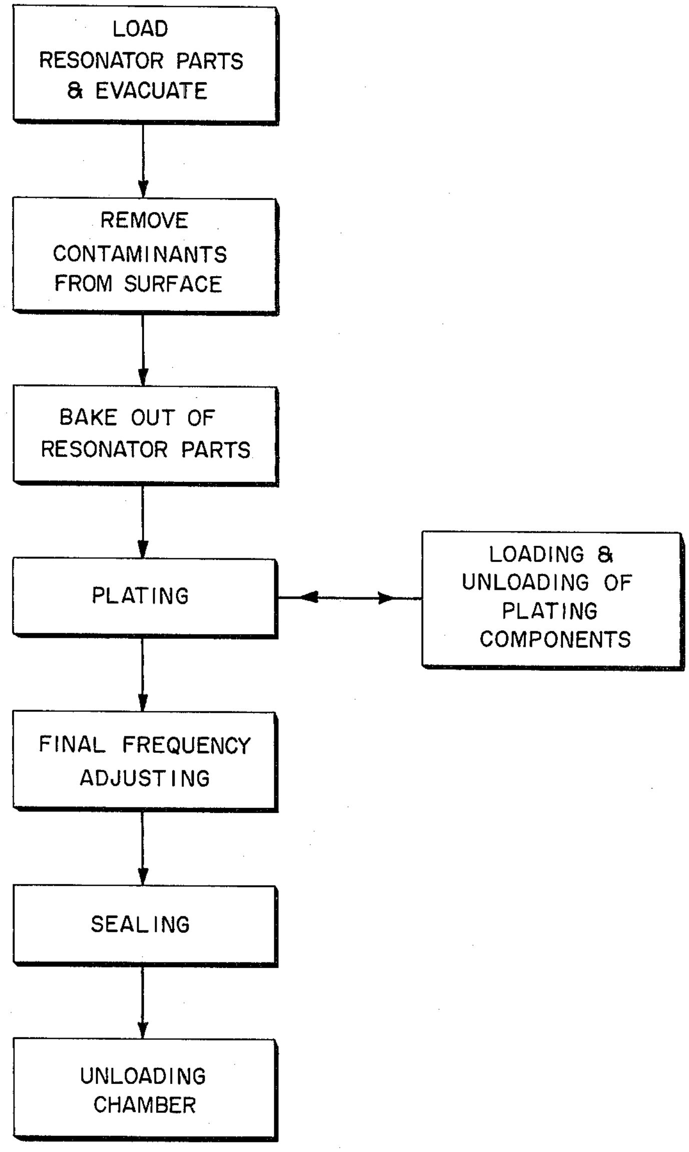
LOAD RESONATOR PARTS & EVACUATE
REMOVE CONTAMINANTS FROM SURFACE
BAKE OUT OF RESONATOR PARTS
PLATING
LOADING & UNLOADING OF PLATING COMPONENTS
FINAL FREQUENCY ADJUSTING
SEALING
UNLOADING CHAMBER

METHOD FOR PROCESSING QUARTZ CRYSTAL RESONATORS

BACKGROUND OF THE INVENTION

This invention relates to a method of processing precision quartz crystal resonators and is copending with US patent application Ser. No. 475,077 filed May 31, 1974 of Erich Hafner and John R. Vig for "Crystal Resonator Housing Configurations" and assigned to a common assignee. In Ser. No. 475,077, improved crystal resonator packages or housing configurations are disclosed and claimed in which the problems of aging and thermal hystereses are minimized or avoided.

SUMMARY OF THE INVENTION

The general object of this invention is to provide a method of processing precision quartz resonators. A particular object of this invention is to provide a method of processing the crystal resonator housing configurations of Ser. No. 475,077.

Such a method is provided by processing the precision quartz crystal resonators in a high vacuum system in which all processing steps are performed in the same vacuum system without venting between steps. The processing steps include: cleaning the resonator parts to remove contaminants from the surface, baking the resonator parts at temperatures up to 450°C to further remove adsorbed and absorbed contaminants, plating electrodes onto the crystal resonator, and sealing the resonator parts.

DESCRIPTION OF THE DRAWING

The drawing is a flow diagram of the sequence of processing steps according to the invention.

Resonator parts as referred to in the steps of the drawing are the mounted resonator including crystal blank, mounting clips, and base or frame; and the cover or covers for the mounted resonator. After the resonator parts have been chemically cleaned, they are inserted in the loading chamber of a semiautomatic processing system. The following processing steps, cleaning, bakeout, plating, etc are performed in an oil free ultrahigh vacuum system without venting between steps. In one embodiment of the invention, each of the processing steps is carried out in a separate chamber, the chambers of the system being interconnected and designed to remain under vacuum continuously. In all instances, the transfer of the resonator parts from one chamber to the next chamber is accomplished without exposure to the air. Only oil free pumps are used. All backfilling is with a pure dry gas such as nitrogen, argon, oxygen, etc.

In the cleaning step, contaminants can be removed from the surface of the resonator parts by bombardment with oxygen or inert gas ions to obtain an atomically clean surface. In such a case, provision is made for measuring the time and energy of ion bombardment and the type and purity of gas used. Provision can also be made for using other gases and mixtures of gases. The ion bombardment is conducted with ion energies near the minimum required for removing material from a quartz surface. In lieu of ion bombardment, cleaning may be accomplished by irradiation with ultraviolet light in the presence of a small partial pressure of oxygen as for example $10^{-4}$ torr of $O_2$. In some instances, all processing steps can be carried out in the presence of ultraviolet irradiation, by flooding the chambers with U.V. light.

Without venting the vacuum system, the mounted resonator and the enclosure parts are then transferred to the bakeout chamber, and the parts are baked to further remove adsorbed and absorbed contaminants. Bakeout is accomplished at temperatures variable up to 450°C.

Without venting the vacuum system, the resonator parts are then transferred to the plating chamber or station where the electrodes are deposited. The electrodes are conveniently deposited by thermal evaporation. In order to minimize stresses that can cause aging, the two sides of the resonator are plated simultaneously at near equal rates. In order to minimize the aging due to mass transfer inside the completed resonator, the electrode material is of high purity and is deposited onto the crystal units rapidly so as to minimize the sorption of contaminants by the electrodes during deposition. The changing and outgassing of the evaporation sources and the replenishing and outgassing of the electrode material may be accomplished in the loading and unloading or outgassing chamber. The rate of evaporation is adjustable.

Since the plating is done very rapidly in the plating chamber, it is extremely difficult, if not impossible, to plate to the final frequency in one step. Therefore, a separate chamber may be added for adjustment of the final frequency. This adjustment can be accomplished by overplating in the plating chamber, that is, plating an excess amount, and then removing the electrode material by ion bombardment. In the alternatives, the excess electrode material can also be removed by laser trimming or additional material can be added by plating.

Without venting the vacuum system, the resonator parts are transferred to the sealing chamber where the parts may be given a final cleaning by ultraviolet irradiation immediately prior to sealing. The enclosure is then sealed by a non contaminating sealing method. Such a non contaminating method is based on the fact that similar metal surfaces will weld under near zero pressures provided both surfaces are atomically clean. The major, and probably only, barrier to metal adhesion is contamination. Even when dissimilar metal couples are tested, and even when the metal couples are insoluble in one another, good welds are achieved in ultrahigh vacuum, provided the surfaces have been rigorously cleaned. The welds show strengths comparable to the bulk strength of the weaker couple member, even when the loadings on couples consisting of a flat plate and spherical indenter are under 0.05 grams. Under such light loads, the deformations at the interface are predominatly elastic. For clean surfaces, the adhesion strength shows no load dependence. The only effect of increased loading is to increase the real area of physical contact. The force needed to separate the surfaces, divided by the real area of contact, remains a constant, however.

For contaminated surfaces, good welds are produced only if the metal surfaces are compressed to loads well in excess of the elastic limits of the metals. The presence of only a few monolayers of contamination substantially reduces the junction strengths. In general, the more contaminated the surfaces are, the higher the percentage of mechanical deformation that is necessary to achieve a bond strength near the bulk strength of the metals.

Thus, the sealing method used relies on the adhesion between atomically clean surfaces. Theoretically, if the sealing surfaces of the enclosure are perfectly clean and perfectly flat, then when the covers are placed on the frame, an hermetic seal results without the application of either heat or pressure. In practice, the sealing surface are plated with a soft material such as gold, indium, tin, aluminum or various soft alloys. One or more small diameter wire O-rings of a suitable material plus pressure and heat (if necessary) are then used to compensate for small surface irregularities and contaminants. Alternately, the O-rings can be replaced with one or more ridges on one of the sealing surfaces.

Several metals which form stable oxides, e.g. Al, Fe, Nb, Cu and Ti, show good adhesion to alumina in high vacuum, when both surfaces have been rigorously cleaned. Thus in a process such as described in the drawing, an enclosure, with O-rings of a suitable metal, can be sealed hermetically without prior metallization of the sealing surfaces, even when the sealing surfaces are non metallic. The sealing apparatus used may be capable of applying a force that is variable up to 5 tons and capable of heating the package up to 400°C. Moreover, the sealing apparatus may be capable of providing combinations of these pressures and temperatures simultaneously. The sealed crystal units are then transferred to the unloading chamber for unloading so that the sealing chamber can remain continuously under high vacuum.

The method of the invention has distinct advantages over currently used methods of processing quartz crystal resonators. That is, presently used methods all involve some exposure of the resonator parts to air during the processing steps. Such exposure to air is known to cause contamination of surfaces of the resonator parts, which in turn, is known to lead to instabilities. For example, the aging requirement for 5MHz fundamental mode crystal units is 2 parts in $10^{10}$ per week. If contamination equivalent to a single atomic layer of quartz is deposited or removed from the surface of such a resonator, the frequency of the resonator changes by about 3 parts per million. This implies that the maximum allowable rate of contamination change on the resonator is less than 0.001 atomic layer per week. When contamination is present, even in a vacuum chamber, at $10^{-6}$ torr pressure, an atomic layer of contamination can deposit on a clean surface in one second. It is therefore essential that during the processing of precision quartz crystal resonators, that the resonator parts not be exposed to contaminating atmospheres such as air.

We wish it to be understood that we do not desire to be limited to the exact details of construction shown and described, for obvious modifications will occur to a person skilled in the art.

What is claimed is:

1. Method of processing precision quartz crystal resonators in a high vacuum system in which all processing steps are performed in the same vacuum system without venting between steps, and wherein said processing steps are each carried out in separate vacuum chambers, said chambers being interconnected to prevent exposure of the resonator parts to contaminating atmospheres during transfer between chambers, said processing steps including:

a. cleaning the resonator parts to remove contaminants from the surface, b. baking the resonator parts at temperatures up to 450°C to further remove adsorbed and absorbed contaminants, c. depositing electrodes onto the crystal resonator, and d. sealing the resonator parts.

2. Method according to claim 1 wherein the cleaning in step (a) is by ion bombardment.

3. Method according to claim 1 wherein the cleaning in step (a) is by irradiation with ultraviolet light in the presence of a small partial pressure of oxygen.

4. Method according to claim 1 wherein the electrode deposition in step (c) is by thermal evaporation.

5. Method according to claim 1 wherein the electrode deposition in step (c) is by simultaneous plating onto the two sides of the resonator at near equal rates.

6. Method according to claim 1 wherein in the electrode deposition in step (c), a loading and outgassing chamber is used for the changing and outgassing of the evaporation sources and the replenishing and outgassing of the electrode material.

7. Method according to claim 1 wherein the electrode deposition in step (c) is followed by ion bombardment for adjustment of the final frequency.

8. Method according to claim 1 wherein the electrode deposition in step (c) is followed by laser trimming for adjustment of the final frequency.

9. Method according to claim 1 wherein the sealing is carried out at pressures variable up to 5 tons and at temperatures up to 400°C.

10. Method according to claim 1 wherein the vacuum chambers are maintained clean by irradiation with ultraviolet light.

11. Method according to claim 1 wherein sealing is achieved by pressing two near atomically cleaned metal surfaces together.

12. Method according to claim 1 wherein the sealing is achieved with a metal O-ring between two near atomically clean surfaces.

13. Method according to claim 11 wherein heat is applied to the sealing surfaces during the sealing step.

14. Method according to claim 12 wherein heat is applied to the sealing surfaces during the sealing step.

15. Method according to claim 1 wherein sealing of the resonator parts in step (d) is accomplished by positioning a metal O-ring between a pair of rigorously cleaned, unmetallized aluminum surfaces of the resonator enclosure, said metal O-ring being selected from the group consisting of aluminum, iron, niobium, copper, and titanium and wherein a force up to five tons at a temperature up to 400°C is applied to effect the seal.

* * * * *

UNITED STATES PATENT AND TRADEMARK OFFICE
CERTIFICATE OF CORRECTION

PATENT NO. : 3,914,836
DATED : October 28, 1975
INVENTOR(S) : Erich Hafner and John R. Vig It is certified that error appears in the above–identified patent and that said Letters Patent are hereby corrected as shown below:

In column 4, line 55, "aluminum" should be -- alumina --.

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*